US009536803B2

(12) United States Patent
Sheridan et al.

(10) Patent No.: US 9,536,803 B2
(45) Date of Patent: Jan. 3, 2017

(54) INTEGRATED POWER MODULE WITH IMPROVED ISOLATION AND THERMAL CONDUCTIVITY

(71) Applicant: RF Micro Devices, Inc., Greensboro, NC (US)

(72) Inventors: David Charles Sheridan, Greensboro, NC (US); Robert Charles Dry, Oak Ridge, NC (US); Don Willis, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/847,558

(22) Filed: Sep. 8, 2015

(65) Prior Publication Data

US 2016/0071781 A1 Mar. 10, 2016

Related U.S. Application Data

(60) Provisional application No. 62/046,236, filed on Sep. 5, 2014.

(51) Int. Cl.
*H01L 23/34* (2006.01)
*H01L 25/07* (2006.01)
(Continued)

(52) U.S. Cl.
CPC ......... *H01L 23/345* (2013.01); *H01L 23/3677* (2013.01); *H01L 23/3736* (2013.01);
(Continued)

(58) Field of Classification Search
CPC ............. H01L 29/4232; H01L 29/0891; H01L 27/095; H01L 29/78; H01L 27/088; H01L 29/1079; H01L 23/36; H01L 23/345; H01L 23/3736; H01L 23/3675
See application file for complete search history.

(56) References Cited

U.S. PATENT DOCUMENTS 4,236,119 A    11/1980 Battjes
4,317,055 A    2/1982 Yoshida et al.
(Continued)

FOREIGN PATENT DOCUMENTS

EP    1187229 A1    3/2002
EP    1826041 A1    8/2007
(Continued)

OTHER PUBLICATIONS

Author Unknown, "CGHV1J006D: 6 W, 18.0 GHz, GaN HEMT Die," Cree, Inc., 2014, 9 pages.
(Continued)

*Primary Examiner* — Alonzo Chambliss
(74) *Attorney, Agent, or Firm* — Withrow & Terranova, P.L.L.C.

(57) ABSTRACT

An integrated power module having a depletion mode device and an enhancement mode device that is configured to prevent an accidental on-state condition for the depletion mode device during a gate signal loss is disclosed. In particular, the disclosed integrated power module is structured to provide improved isolation and thermal conductivity. The structure includes a substrate having a bottom drain pad for the depletion mode device disposed on the substrate and an enhancement mode device footprint-sized cavity that extends through the substrate to the bottom drain pad. A thermally conductive and electrically insulating slug substantially fills the cavity to provide a higher efficient thermal path between the enhancement mode device and the bottom drain pad for the depletion mode device.

20 Claims, 3 Drawing Sheets

(51) Int. Cl.
*H05K 7/20* (2006.01)
*H01L 27/095* (2006.01)
*H01L 27/088* (2006.01)
*H01L 29/10* (2006.01)
*H01L 23/373* (2006.01)
*H01L 23/367* (2006.01)
*H01L 23/498* (2006.01)
*H01L 29/423* (2006.01)

(52) U.S. Cl.
CPC ...... *H01L 23/49844* (2013.01); *H01L 25/072* (2013.01); *H01L 27/088* (2013.01); *H01L 27/095* (2013.01); *H01L 29/1079* (2013.01); *H05K 7/205* (2013.01); *H05K 7/20963* (2013.01); *H01L 23/49827* (2013.01); *H01L 29/4232* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01)

(56) References Cited

U.S. PATENT DOCUMENTS

| | | | |
|---|---|---|---|
| 4,540,954 A | 9/1985 | Apel | |
| 4,543,535 A | 9/1985 | Ayasli | |
| 4,620,207 A | 10/1986 | Calviello | |
| 4,788,511 A | 11/1988 | Schindler | |
| 5,028,879 A | 7/1991 | Kim | |
| 5,046,155 A | 9/1991 | Beyer et al. | |
| 5,047,355 A | 9/1991 | Huber et al. | |
| 5,107,323 A | 4/1992 | Knolle et al. | |
| 5,118,993 A | 6/1992 | Yang | |
| 5,208,547 A | 5/1993 | Schindler | |
| 5,227,734 A | 7/1993 | Schindler et al. | |
| 5,306,656 A | 4/1994 | Williams et al. | |
| 5,361,038 A | 11/1994 | Allen et al. | |
| 5,365,197 A | 11/1994 | Ikalainen | |
| 5,389,571 A | 2/1995 | Takeuchi et al. | |
| 5,406,111 A | 4/1995 | Sun | |
| 5,414,387 A | 5/1995 | Nakahara et al. | |
| 5,485,118 A | 1/1996 | Chick | |
| 5,608,353 A | 3/1997 | Pratt | |
| 5,629,648 A | 5/1997 | Pratt | |
| 5,698,870 A | 12/1997 | Nakano et al. | |
| 5,742,205 A | 4/1998 | Cowen et al. | |
| 5,764,673 A | 6/1998 | Kawazu et al. | |
| 5,834,326 A | 11/1998 | Miyachi et al. | |
| 5,843,590 A | 12/1998 | Miura et al. | |
| 5,864,156 A | 1/1999 | Juengling | |
| 5,874,747 A | 2/1999 | Redwing et al. | |
| 5,880,640 A | 3/1999 | Dueme | |
| 5,914,501 A | 6/1999 | Antle et al. | |
| 5,949,140 A | 9/1999 | Nishi et al. | |
| 6,049,250 A | 4/2000 | Kintis et al. | |
| 6,064,082 A | 5/2000 | Kawai et al. | |
| 6,110,757 A | 8/2000 | Udagawa | |
| 6,130,579 A | 10/2000 | Iyer et al. | |
| 6,133,589 A | 10/2000 | Krames et al. | |
| 6,177,685 B1 | 1/2001 | Teraguchi et al. | |
| 6,191,656 B1 | 2/2001 | Nadler | |
| 6,229,395 B1 | 5/2001 | Kay | |
| 6,265,943 B1 | 7/2001 | Dening et al. | |
| 6,271,727 B1 | 8/2001 | Schmukler | |
| 6,285,239 B1 | 9/2001 | Iyer et al. | |
| 6,306,709 B1 | 10/2001 | Miyagi et al. | |
| 6,307,364 B1 | 10/2001 | Augustine | |
| 6,313,705 B1 | 11/2001 | Dening et al. | |
| 6,329,809 B1 | 12/2001 | Dening et al. | |
| 6,333,677 B1 | 12/2001 | Dening | |
| 6,342,815 B1 | 1/2002 | Kobayashi | |
| 6,356,150 B1 | 3/2002 | Spears et al. | |
| 6,369,656 B2 | 4/2002 | Dening et al. | |
| 6,369,657 B2 | 4/2002 | Dening et al. | |
| 6,373,318 B1 | 4/2002 | Dohnke et al. | |
| 6,376,864 B1 | 4/2002 | Wang | |
| 6,377,125 B1 | 4/2002 | Pavio et al. | |
| 6,384,433 B1 | 5/2002 | Barratt et al. | |
| 6,387,733 B1 | 5/2002 | Holyoak et al. | |
| 6,392,487 B1 | 5/2002 | Alexanian | |
| 6,400,226 B2 | 6/2002 | Sato | |
| 6,404,287 B2 | 6/2002 | Dening et al. | |
| 6,418,174 B1 | 7/2002 | Benedict | |
| 6,448,793 B1 | 9/2002 | Barratt et al. | |
| 6,455,877 B1 | 9/2002 | Ogawa et al. | |
| 6,455,925 B1 * | 9/2002 | Laureanti | H01L 23/3677 257/678 |
| 6,475,916 B1 | 11/2002 | Lee et al. | |
| 6,477,682 B2 | 11/2002 | Cypher | |
| 6,521,998 B1 | 2/2003 | Teraguchi et al. | |
| 6,525,611 B1 | 2/2003 | Dening et al. | |
| 6,528,983 B1 | 3/2003 | Augustine | |
| 6,560,452 B1 | 5/2003 | Shealy | |
| 6,566,963 B1 | 5/2003 | Yan et al. | |
| 6,589,877 B1 | 7/2003 | Thakur | |
| 6,593,597 B2 | 7/2003 | Sheu | |
| 6,608,367 B1 | 8/2003 | Gibson et al. | |
| 6,614,281 B1 | 9/2003 | Baudelot et al. | |
| 6,621,140 B1 | 9/2003 | Gibson et al. | |
| 6,624,452 B2 | 9/2003 | Yu et al. | |
| 6,627,552 B1 | 9/2003 | Nishio et al. | |
| 6,633,073 B2 | 10/2003 | Rezvani et al. | |
| 6,633,195 B2 | 10/2003 | Baudelot et al. | |
| 6,639,470 B1 | 10/2003 | Andrys et al. | |
| 6,656,271 B2 | 12/2003 | Yonehara et al. | |
| 6,657,592 B2 | 12/2003 | Dening et al. | |
| 6,660,606 B2 | 12/2003 | Miyabayashi et al. | |
| 6,701,134 B1 | 3/2004 | Epperson | |
| 6,701,138 B2 | 3/2004 | Epperson et al. | |
| 6,706,576 B1 | 3/2004 | Ngo et al. | |
| 6,720,831 B2 | 4/2004 | Dening et al. | |
| 6,723,587 B2 | 4/2004 | Cho et al. | |
| 6,724,252 B2 | 4/2004 | Ngo et al. | |
| 6,727,762 B1 | 4/2004 | Kobayashi | |
| 6,748,204 B1 | 6/2004 | Razavi et al. | |
| 6,750,158 B2 | 6/2004 | Ogawa et al. | |
| 6,750,482 B2 | 6/2004 | Seaford et al. | |
| 6,759,907 B2 | 7/2004 | Orr et al. | |
| 6,802,902 B2 | 10/2004 | Beaumont et al. | |
| 6,815,722 B2 | 11/2004 | Lai et al. | |
| 6,815,730 B2 | 11/2004 | Yamada | |
| 6,822,842 B2 | 11/2004 | Friedrichs et al. | |
| 6,861,677 B2 | 3/2005 | Chen | |
| 6,943,631 B2 | 9/2005 | Scherrer et al. | |
| 7,015,512 B2 | 3/2006 | Park et al. | |
| 7,026,665 B1 | 4/2006 | Smart et al. | |
| 7,033,961 B1 | 4/2006 | Smart et al. | |
| 7,042,150 B2 | 5/2006 | Yasuda | |
| 7,052,942 B1 | 5/2006 | Smart et al. | |
| 7,135,747 B2 | 11/2006 | Allen et al. | |
| 7,211,822 B2 | 5/2007 | Nagahama et al. | |
| 7,408,182 B1 | 8/2008 | Smart et al. | |
| 7,449,762 B1 | 11/2008 | Singh | |
| 7,459,356 B1 | 12/2008 | Smart et al. | |
| 7,557,421 B1 | 7/2009 | Shealy et al. | |
| 7,719,055 B1 | 5/2010 | McNutt et al. | |
| 7,768,758 B2 | 8/2010 | Maier et al. | |
| 7,804,262 B2 | 9/2010 | Schuster et al. | |
| 7,923,826 B2 * | 4/2011 | Takahashi | H01L 21/561 257/675 |
| 7,935,983 B2 | 5/2011 | Saito et al. | |
| 7,968,391 B1 | 6/2011 | Smart et al. | |
| 7,974,322 B2 | 7/2011 | Ueda et al. | |
| 8,017,981 B2 | 9/2011 | Sankin et al. | |
| 8,110,915 B2 * | 2/2012 | Fowlkes | H01L 23/3677 257/692 |
| 8,237,198 B2 | 8/2012 | Wu et al. | |
| 8,405,068 B2 | 3/2013 | O'Keefe | |
| 8,502,258 B2 | 8/2013 | O'Keefe | |
| 8,530,978 B1 | 9/2013 | Chu et al. | |
| 8,633,518 B2 | 1/2014 | Suh et al. | |
| 8,692,294 B2 | 4/2014 | Chu et al. | |
| 8,729,680 B2 * | 5/2014 | Kobayashi | H01L 23/3677 257/664 |

(56) References Cited

U.S. PATENT DOCUMENTS

| | | |
|---|---|---|
| 8,785,976 B2 | 7/2014 | Nakajima et al. |
| 8,988,097 B2 | 3/2015 | Ritenour |
| 9,070,761 B2 | 6/2015 | Johnson |
| 9,082,836 B2 | 7/2015 | Senda |
| 9,093,420 B2 | 7/2015 | Kobayashi et al. |
| 9,124,221 B2 | 9/2015 | Vetury et al. |
| 9,129,802 B2 | 9/2015 | Ritenour |
| 9,136,341 B2 | 9/2015 | Kobayashi et al. |
| 2001/0040246 A1 | 11/2001 | Ishii |
| 2001/0054848 A1 | 12/2001 | Baudelot et al. |
| 2002/0005528 A1 | 1/2002 | Nagahara |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0144991 A1 | 7/2004 | Kikkawa |
| 2004/0227211 A1 | 11/2004 | Saito et al. |
| 2004/0241916 A1 | 12/2004 | Chau et al. |
| 2005/0110042 A1 | 5/2005 | Saito et al. |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2005/0274977 A1 | 12/2005 | Saito et al. |
| 2006/0043385 A1 | 3/2006 | Wang et al. |
| 2006/0043501 A1 | 3/2006 | Saito et al. |
| 2006/0054924 A1 | 3/2006 | Saito et al. |
| 2006/0068601 A1 | 3/2006 | Lee et al. |
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2006/0246680 A1 | 11/2006 | Bhattacharyya |
| 2006/0249750 A1 | 11/2006 | Johnson et al. |
| 2006/0255377 A1 | 11/2006 | Tu |
| 2007/0026676 A1 | 2/2007 | Li et al. |
| 2007/0093009 A1 | 4/2007 | Baptist et al. |
| 2007/0138545 A1 | 6/2007 | Lin et al. |
| 2007/0158692 A1 | 7/2007 | Nakayama et al. |
| 2007/0164326 A1 | 7/2007 | Okamoto et al. |
| 2007/0205433 A1 | 9/2007 | Parikh et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0217753 A1* | 9/2008 | Otani ................ H01L 21/565 257/690 |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0200576 A1 | 8/2009 | Saito et al. |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0025737 A1 | 2/2010 | Ishikura |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0031633 A1 | 2/2011 | Hsu et al. |
| 2011/0095337 A1 | 4/2011 | Sato |
| 2011/0101300 A1 | 5/2011 | O'Keefe |
| 2011/0108887 A1 | 5/2011 | Fareed et al. |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0199955 A1* | 8/2012 | Sun .................. H01L 23/3677 257/629 |
| 2012/0211802 A1 | 8/2012 | Tamari |
| 2012/0218783 A1 | 8/2012 | Imada |
| 2012/0262220 A1 | 10/2012 | Springett |
| 2013/0032897 A1 | 2/2013 | Narayanan et al. |
| 2013/0277687 A1 | 10/2013 | Kobayashi et al. |
| 2013/0280877 A1 | 10/2013 | Kobayashi et al. |
| 2014/0117559 A1 | 5/2014 | Zimmerman et al. |
| 2014/0264266 A1 | 9/2014 | Li et al. |
| 2014/0264454 A1 | 9/2014 | Banerjee et al. |

FOREIGN PATENT DOCUMENTS

| | | |
|---|---|---|
| JP | H10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Boutros, K.S., et al., "5W GaN MMIC for Millimeter-Wave Applications," 2006 Compound Semiconductor Integrated circuit Symposium, Nov. 2006, pp. 93-95.

Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Cho, H., et al., "High Density Plasma Via Hole Etching in SiC," Journal of Vacuum Science & Technology A: Surfaces and Films, vol. 19, No. 4, Jul./Aug. 2001, pp. 1878-1881.

Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.

Fath, P. et al., "Mechanical wafer engineering for high efficiency solar cells: An investigation of the induced surface Damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p—GaN Using Oxidized Ni/Au and Al or Ag," Applied Physics Letters, vol. 83, No. 2, Jul. 14, 2003, pp. 311-313.

(56) References Cited

OTHER PUBLICATIONS

Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Shchekin, O.B. et al., "High performance thin-film flip-chip InGaN—GaN light-emitting diodes," Applied Physics Letters, vol. 89, 071109, Aug. 2006, 4 pages.
Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Wierer, J.J., et al., "High-power AlGaInN flip-chip light-emitting diodes," Applied Physics Letters, vol. 78, No. 22, May 28, 2001, pp. 3379-3381.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on high-efficiency surface-textured light-emitting diodes," Applied Physics Letters, Oct. 8, 2001, vol. 79, No. 15, pp. 2315-2317.
Final Office Action for U.S. Appl. No. 10/620,205, mailed Dec. 16, 2004, 9 pages.
Non-Final Office Action for U.S. Appl. No. 10/620,205, mailed Jul. 23, 2004, 7 pages.
Non-Final Office Action for U.S. Appl. No. 10/620,205, mailed May 3, 2005, 10 pages.
Non-Final Office Action for U.S. Appl. No. 10/689,980, mailed Jan. 26, 2005, 7 pages.
Non-Final Office Action for U.S. Appl. No. 10/689,980, mailed May 12, 2005, 8 pages.
Non-Final Office Action for U.S. Appl. No. 11/397,279, mailed Oct. 31, 2007, 7 pages.
Notice of Allowance for U.S. Appl. No. 11/397,279, mailed Apr. 17, 2008, 7 pages.
Final Office Action for U.S. Appl. No. 10/689,979, mailed Jun. 29, 2005, 16 pages.
Non-Final Office Action for U.S. Appl. No. 10/689,979, mailed Jan. 11, 2005, 14 pages.
Notice of Allowance for U.S. Appl. No. 10/689,979, mailed Oct. 26, 2005, 6 pages.
Non-Final Office Action for U.S. Appl. No. 11/360,734, mailed Jan. 18, 2008, 10 pages.
Notice of Allowance for U.S. Appl. No. 11/360,734, mailed Aug. 7, 2008, 6 pages.
Final Office Action for U.S. Appl. No. 11/937,207, mailed Nov. 19, 2009, 9 pages.
Non-Final Office Action for U.S. Appl. No. 11/937,207, mailed Mar. 18, 2010, 10 pages.
Non-Final Office Action for U.S. Appl. No. 11/937,207, mailed May 29, 2009, 11 pages.
Notice of Allowance for U.S. Appl. No. 11/937,207, mailed Feb. 28, 2011, 8 pages.
Quayle Action for U.S. Appl. No. 11/937,207, mailed Nov. 24, 2010, 4 pages.
Final Office Action for U.S. Appl. No. 11/458,833, mailed Dec. 15, 2008, 13 pages.
Non-Final Office Action for U.S. Appl. No. 11/458,833, mailed Apr. 1, 2008, 10 pages.
Notice of Allowance for U.S. Appl. No. 11/458,833, mailed Mar. 9, 2009, 7 pages.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Invitation to Pay Fees for PCT/US2013/056105, mailed Nov. 5, 2013, 7 pages.
International Search Report and Written Opinion for PCT/US2013/056105, mailed Feb. 12, 2014, 15 pages.
Non-Final Office Action for U.S. Appl. No. 13/910,202, mailed Sep. 25, 2014, 9 pages.
Final Office Action for U.S. Appl. No. 13/910,202, mailed Jan. 20, 2015, 10 pages.
International Search Report and Written Opinion for PCT/US2013/056126, mailed Oct. 25, 2013, 10 pages.
Non-Final Office Action for U.S. Appl. No. 13/927,182, mailed May 1, 2014, 7 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Notice of Allowance for U.S. Appl. No. 13/914,060, mailed Nov. 13, 2014, 8 pages.
Non-Final Office Action for U.S. Appl. No. 13/966,400, mailed Sep. 3, 2014, 9 pages.
Final Office Action for U.S. Appl. No. 13/966,400, mailed Dec. 3, 2014, 8 pages.
Non-Final Office Action for U.S. Appl. No. 13/957,698, mailed Nov. 5, 2014, 11 pages.
International Search Report and Written Opinion for PCT/US2013/056132, mailed Oct. 10, 2013, 11 pages.
Final Office Action for U.S. Appl. No. 13/973,482, mailed Nov. 5, 2014, 9 pages.
International Search Report and Written Opinion for PCT/US2013/056187, mailed Oct. 10, 2013, 11 pages.
Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Final Office Action for U.S. Appl. No. 13/795,986, mailed Dec. 5, 2014, 16 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 12/841,225 mailed Dec. 22, 2011, 8 pages.
Non-Final Office Action for U.S. Appl. No. 12/841,257 mailed Jan. 5, 2012, 13 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Advisory Action for U.S. Appl. No. 13/871,526, mailed Sep. 3, 2015, 3 pages.
International Preliminary Report on Patentability for PCT/US2013/056105, mailed Mar. 5, 2015, 12 pages.
Advisory Action for U.S. Appl. No. 13/910,202, mailed Apr. 6, 2015, 3 pages.
Notice of Allowance for U.S. Appl. No. 13/910,202, mailed May 14, 2015, 9 pages.

(56) References Cited

OTHER PUBLICATIONS

International Preliminary Report on Patentability for PCT/US2013/056126, mailed Mar. 5, 2015, 7 pages.
Final Office Action for U.S. Appl. No. 13/974,488, mailed Feb. 20, 2015, 8 pages.
Notice of Allowance for U.S. Appl. No. 13/974,488, mailed May 29, 2015, 9 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/957,698, mailed Jul. 20, 2015, 7 pages.
Non-Final Office Action for U.S. Appl. No. 14/557,940, mailed Aug. 31, 2015, 8 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Notice of Allowance for U.S. Appl. No. 13/973,482, mailed May 4, 2015, 7 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Advisory Action for U.S. Appl. No. 10/620,205, mailed Feb. 15, 2005, 2 pages.
Notice of Allowance for U.S. Appl. No. 10/620,205, mailed Dec. 8, 2005, 4 pages.
Notice of Allowance for U.S. Appl. No. 12/841,225, mailed Nov. 9, 2012, 5 pages.
Non-Final Office Action for U.S. Appl. No. 14/749,274, mailed Feb. 22, 2016, 6 pages.
Corrected/Supplemental Notice of Allowability for U.S. Appl. No. 13/957,698, mailed Nov. 4, 2015, 4 pages.
Final Office Action for U.S. Appl. No. 14/557,940, mailed Feb. 8, 2016, 8 pages.
Notice of Allowance for U.S. Appl. No. 14/067,019, mailed Oct. 13, 2015, 6 pages.
Huang, Xiucheng et al., "Analytical Loss Model of High Voltage GaN HEMT in Cascode Configuration," IEEE Transactions on Power Electronics, vol. 29, No. 5, May 2014, IEEE, pp. 2208-2219.
Lee, Han S., "GaN-on-Silicon-Based Power Switch in Sintered, Dual-Side Cooled Package," PowerElectronics.com, Jan. 2, 2013, 5 pages, http://powerelectronics.com/discrete-power-semis/gan-silicon-based-power-switch-sintered-dual-side-cooled-package.
Liang, Zhenxian et al., "Embedded Power—An Integration Packaging Technology for IPEMs," The International Journal of Microcircuits and Electronic Packaging, vol. 23, No. 4, 2000, pp. 481-487.
Li, Xueqing et al., "Investigation of SiC Stack and Discrete Cascodes" PowerPoint Presentation, PCIM Europe, May 20-22, 2014, Nuremberg, Germany, 26 slides.
Stevanovic, Ljubisa D. et al., "Low Inductance Power Module with Blade Connector," 2010 Twenty-Fifth Annual IEEE Applied Power Electronics Conference and Exposition (APEC), Feb. 21-25, 2010, IEEE, Palm Springs, CA, pp. 1603-1609.
Lin, C.K. et al., "GaN Lattice Matched ZnO/$Pr_2O_3$ Film as Gate Dielectric Oxide Layer for AlGaN/GaN HEMT," IEEE nternational Conference of Electron Devices and Solid-State Circuits, EDSSC 2009, IEEE, Dec. 25-27, 2009, Xi'an, China, pp. 408-411.
Lin, H. C. et al., "Leakage current and breakdown electric-field studies on ultrathin atomic-layer-deposited $Al_2O_3$ on GaAs," Applied Physics Letters, vol. 87, 2005, pp. 182094-1 to 182094-3.
Lossy, R. et al., "Gallium nitride MIS-HEMT using atomic layer deposited Al2O3 as gate dielectric," Journal of Vacuum Science & Technology A: Vacuum, Surfaces, and Films, vol. 31, No. 1, Jan./Feb. 2013, 6 pages.
Seok, O. et al., "High-breakdown voltage and low on-resistance AlGaN/GaN on Si MOS-HEMTs employing an extended Tan gate on HfO2 gate insulator," Electronics Letters, vol. 49, No. 6, Institute of Engineering and Technology, Mar. 14, 2013, 2 pages.
Tang, K. et al., "Enhancement-mode GaN Hybrid MOS-HEMTs with Breakdown Voltage of 1300V," 21st International Symposium on Power Semiconductor Devices & IC's, ISPSD 2009, IEEE, Jun. 14-18, 2009, Barcelona, Spain, pp. 279-282.
Ye, P.D., et al., "GaN MOS-HEMT Using Atomic Layer Deposition Al2O3 as Gate Dielectric and Surface Passivation," International Journal of High Speed Electronics and Systems, vol. 14, No. 3, 2004, pp. 791-796.
Non-Final Office Action for U.S. Appl. No. 14/731,736, mailed Jan. 14, 2016, 10 pages.
Liang, Zhenxian et al., "Embedded Power—A Multilayer Integration Technology for Packaging of IPEMs and PEBBs," Proceedings of International Workshop on Integrated Power Packaging, Jul. 14-16, 2000, IEEE, pp. 41-45.
Non-Final Office Action for U.S. Appl. No. 13/871,526, mailed Mar. 8, 2016, 13 pages.
Notice of Allowance for U.S. Appl. No. 14/731,736, mailed May 9, 2016, 8 pages.
Final Office Action for U.S. Appl. No. 14/749,274, mailed Jun. 23, 2016, 6 pages.
Notice of Allowance for U.S. Appl. No. 14/749,274, mailed Aug. 15, 2016, 7 pages.
Non-Final Office Action for U.S. Appl. No. 14/797,573, mailed Jul. 7, 2016, 8 pages.
Final Office Action for U.S. Appl. No. 13/871,526, mailed Aug. 30, 2016, 14 pages.
Advisory Action and Examiner-Initiated Interview Summary for U.S. Appl. No. 13/871,526, mailed Oct. 31, 2016, 4 pages.

\* cited by examiner

INTEGRATED POWER MODULE WITH IMPROVED ISOLATION AND THERMAL CONDUCTIVITY

RELATED APPLICATIONS

This application claims the benefit of U.S. provisional patent application No. 62/046,236, filed Sep. 5, 2014, the disclosure of which is incorporated herein by reference in its entirety.

FIELD OF THE DISCLOSURE

The present disclosure is directed to power electronics. In particular, the present disclosure provides an integrated power module with improved electrical isolation and improved thermal conductivity.

BACKGROUND

There are at least three standard methods of packaging multi-chip power modules. One popular method incorporates direct bonded copper (DBC) substrates that comprise a ceramic tile with copper bonded to top and/or bottom sides of the ceramic tile. Alumina ($Al_2O_3$), aluminum nitride (AlN), and beryllium oxide (BeO) are materials that are usable as the ceramic tile. DBC substrates are known for their high thermal conductivity and excellent electrical isolation. DBC substrates comprising AlN and copper have a thermal conductivity of at least 150 Watts per meter Kelvin (W/mK). However, DBC substrates have disadvantages of high cost, large design rules, and a limitation of only one electrical conductor routing layer.

Another multi-chip packaging method utilizes leadframe technology with either DBC isolation or a cascode-stacked die technique. However, present leadframe technology not well suited for multiple die structures that are coplanar. In particular, present leadframe technology can be compromised thermally and/or mechanically when attempted to be used for coplanar multi-chip structures.

Yet another standard multi-chip packaging technology incorporates laminate printed circuit board (PCB) technology. An advantage of laminate PCB technology is low cost, integration flexibility, and electrical conductor routing. However, a significant disadvantage of PCB technology is low thermal performance if there are multiple dies requiring high power dissipation that cannot utilize electrically conducting thermal vias due to unequal electrical potentials on both sides of the vias.

What is needed is an integrated power module with improved electrical isolation and improved thermal conductivity that is structured to realize the advantages of each of the above multi-chip packaging methods while avoiding the discussed limitations of those methods.

SUMMARY

An integrated power module having a depletion mode device and an enhancement mode device that is configured to prevent an accidental on-state condition for the depletion mode device during a gate signal loss is disclosed. In particular, the disclosed integrated power module is structured to provide improved isolation and thermal conductivity. The structure includes a substrate having a bottom drain pad for the depletion mode device disposed on the substrate and an enhancement mode device footprint-sized cavity that extends through the substrate to the bottom drain pad. A thermally conductive and electrically insulating slug substantially fills the cavity to provide a higher efficient thermal path between the enhancement mode device and the bottom drain pad for the depletion mode device.

In at least one exemplary embodiment, a depletion mode device footprint-sized cavity in the substrate is substantially filled with a thermally conductive and electrically conductive slug that provides a higher efficient thermal path between the depletion mode device and the bottom drain pad for the depletion mode device. In yet another exemplary embodiment, the depletion mode device footprint-sized cavity is substantially filled with a thermally conductive and electrically insulating slug that provides a higher efficient thermal path between the depletion mode device and the bottom drain pad for the depletion mode device. In this case electrical connectivity is established with vias from a top-side depletion mode device drain pad to the bottom drain pad for the depletion mode device.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
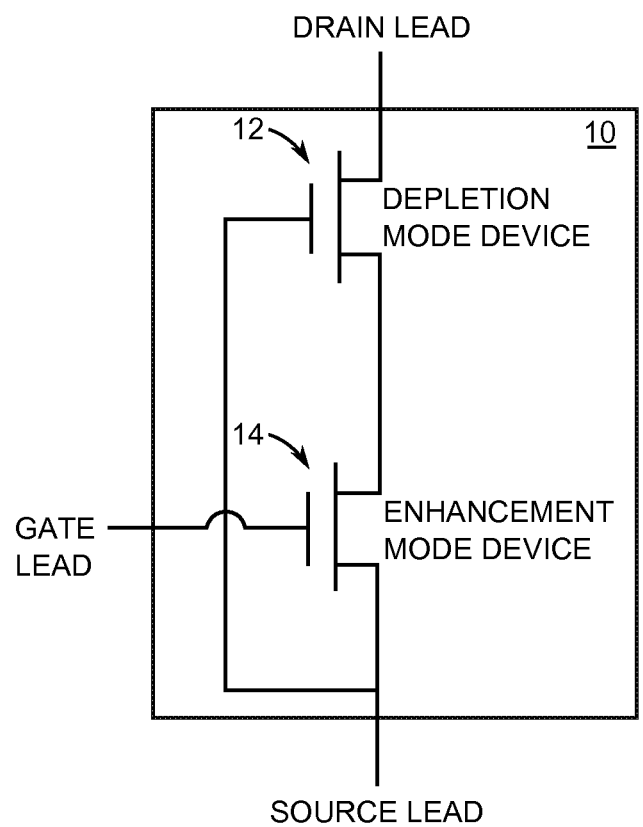
FIG. 1 is an electrical schematic for a cascode topology for an integrated power module of the present disclosure that incorporates an enhancement mode device to ensure that a depletion mode device maintains an off-state in the event of a gate signal failure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Discrete high voltage and high power semiconductor devices are predominantly normally-off, meaning that they are enhancement mode devices. The reason enhancement mode devices are favored is due to safety since an enhancement mode device will not accidently turn during a gate signal failure. However, high performance depletion mode devices have recently been developed. As a result of the nature of the depletion mode, high performance depletion mode devices are inherently normally-on and can present a danger in an event of gate signal failure such as the gate signal falling to a voltage less than needed to maintain the off-state of the depletion mode device. For example, the depletion mode device would accidently turn on if its gate voltage were to inadvertently drop to zero volts while in an off-state. As such, high performance depletion mode devices require auxiliary components and/or topologies to maintain a normally-off condition in the event of gate signal failure.

FIG. 1 is an electrical schematic of a cascode topology for an integrated power module 10 of the present disclosure that ensures that a depletion mode device 12 maintains an off-state in the event of a gate signal failure. In this case, an enhancement mode device 14 maintains control of an off-state for the depletion mode device 12 in the event of gate signal failure. Specifically, an off-state for the enhancement mode device 14 maintains a drain to source voltage drop across the depletion mode device 12 that is reflected across a gate-source junction of the of the enhancement mode device 14, which in turn pinches the depletion mode device 12 to an off-state. In the exemplary embodiment of FIG. 1, the depletion mode device 12 is typically a gallium nitride (GaN) on silicon (Si) high electron mobility transistor (HEMT). The enhancement mode device 12 is typically a low voltage Si metal oxide semiconductor field effect transistor (MOSFET).

Typically, discrete transistors have three leads, which are a gate lead, a source lead, and a drain lead. It is desirable that the integrated power module 10 also adhere to this three lead convention. As such, the topology of the integrated power module 10 is configured to convert six internal connections into a conventional three leaded external topology that provides gate, source, and drain leads. However, adhering to the conventional three leaded external topology presents a problem of providing maximum heat transfer from inside the integrated power module 10 to external the integrated power module 10. Simply put, a three leaded device conversion of a six leaded multi-chip device cannot transfer as much heat as a single chip three leaded device of the same size because significant thermal paths are disrupted in a six leaded multi-chip device.

The disruption of thermal paths inside the integrated power module 10 is due to a need for electrical isolation between parts of the depletion mode device 12 and parts of the enhancement mode device 14 that are at different voltage potentials. This thermal challenge is most pronounced for lateral devices such as devices with a GaN on silicon carbide (SiC) die and a GaN on Si die, both of which need backside electrical isolation. Moreover, it is desirable that a first die comprising the depletion mode device 12 and a second die comprising the enhancement mode device 14 be substantially coplanar.

Figure 2:
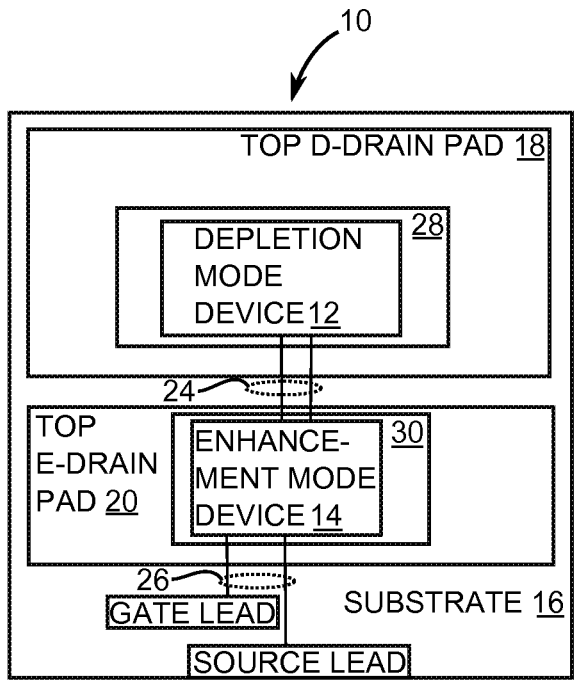
FIG. 2 is a top x-ray view of an exemplary embodiment of the integrated power module of the present disclosure that has improved electrical isolation and improved thermal conductivity.

FIG. 2 is a top x-ray view of an exemplary embodiment of the integrated power module 10 of the present disclosure that has improved electrical isolation and improved thermal conductivity. The integrated power module 10 includes a substrate 16 that supports the depletion mode device 12 and the enhancement mode device 14. The substrate 16 is a printed circuit type laminate that typically includes copper traces that route power and signals to and from the depletion mode device 12 and the enhancement mode device 14. In at least one embodiment, the substrate 16 is made of material formulated to provide substantially low dielectric losses for gigahertz radio frequency operation of the depletion mode device 12 and the enhancement mode device 14.

A top-side depletion device (top d-drain) pad 18 is disposed onto a top-side of the substrate 16 to which a drain contact (drain-1) of the depletion mode device 12 is electrically coupled. Further still, a top-side enhancement device (top e-drain) pad 20 is also disposed onto the top-side of the substrate 16 to which a drain contact (drain-2) of the enhancement mode device 14 is electrically coupled. The top e-drain pad 20 is spaced from the top d-drain pad 18 to electrically isolate the top d-drain pad 18 from the top e-drain pad 20. Inter-device bond wires 24 couple selected terminals between the depletion mode device 12 and enhancement mode device 14. Extra-device bond wires 26 couple gate and source contacts on the enhancement mode device 14 to gate and source leads disposed onto the substrate 16.

Figure 3:
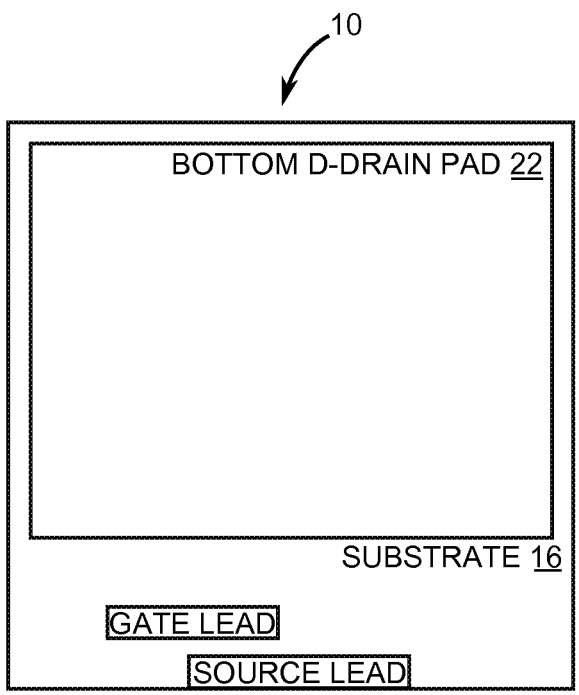
FIG. 3 is a backside view of the exemplary embodiment of FIG. 1.

FIG. 3 depicts a bottom-side depletion device drain (bottom d-drain) pad 22 to which a thermally and electrically conductive slug (TECS) 28 is bonded to create a higher efficient thermal path between the depletion mode device 12 and the bottom d-drain pad 22. An external heatsink (not shown) can be coupled to the bottom d-drain pad 22 using a fastener and a paste type thermal compound.

In the exemplary embodiment of FIG. 2 and FIG. 3, the substrate 16 includes a first cavity wherein the TECS 28 is inserted. In at least one embodiment, the TECS 28 has a thermal resistivity that is at least 10 times lower than the thermal resistivity of the substrate 16 and an electrical resistivity that is substantially equal to or less than the electrical resistivity of the bottom d-drain pad 22. In the exemplary embodiment of the integrated power module 10 depicted in FIG. 2 and FIG. 3, the TECS 28 is made of a material such as copper that is both thermally and electrically conductive.

Figure 4:
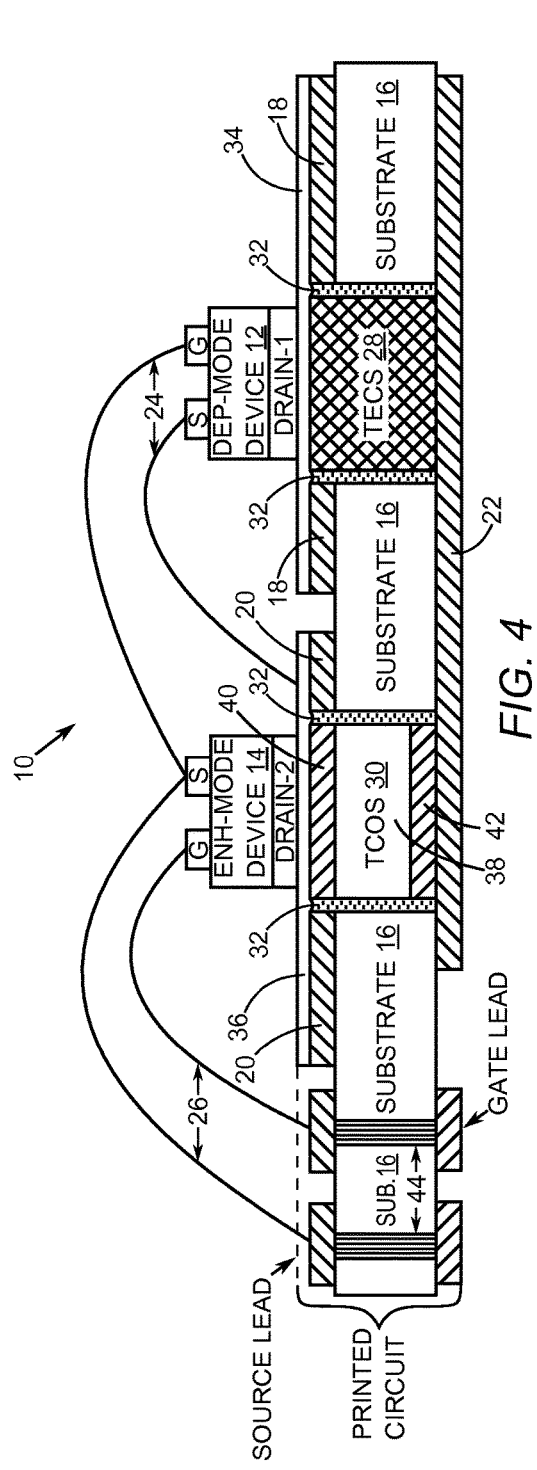
FIG. 4 is a cross-sectional view of FIGS. 2 and 3.

FIG. 4 is a cross-sectional view of the integrated power module 10 depicted in FIG. 2 and FIG. 3. This cross-sectional view shows the TECS 28 embedded within the substrate 16 and bonded to the substrate 16 using non-conductive epoxy 32. A first plating 34 that is electrically conductive is disposed over the top d-drain pad 18 to electrically and thermally couple the drain of the depletion mode device 12 to the top d-drain pad 18 after the TECS 28 is embedded within the substrate 16. The drain contact drain-1 of the depletion mode device 12 is soldered or welded to the first plating 34 at a location substantially centered over the TECS 28. Bonding of the TECS 28 to the bottom d-drain pad 22 is achieved using soldering or welding. Moreover, in the exemplary embodiment, the TECS 28 has an area that is at least equal to an area taken up by the largest surface of the depletion mode device 12. However, it is to be understood that the TECS 28 can have a slightly smaller surface area than area taken up by the largest surface of the depletion mode device without deviating from scope of the present disclosure.

A second cavity is provided within the substrate 16 wherein a thermally conductive only slug (TCOS) 30 is inserted. Typically, the TCOS 30 has a thermal resistivity that is at least 2 times lower than the thermal resistivity of the substrate 16 that is bonded between the e-drain pad 20 and the enhancement mode device 14. The TCOS 30 is bonded to the substrate 16 with the second cavity using a non-conductive epoxy 32. Once securely embedded within the substrate 16, the TCOS 30 provides a highly efficient thermal path between the enhancement mode device 14 and the bottom d-drain pad 22. A second plating 36 that is electrically conductive is disposed over the top e-drain pad 20 to electrically and thermally couple the drain contact (drain-2) of the enhancement mode device 14 to the e-drain pad 20 after the TECS 28 is embedded within the substrate 16.

In the exemplary case of FIGS. 2-4, the TCOS 30 is electrically isolating, yet also thermally conductive. A second drain contact drain-2 of the enhancement mode device 14 is soldered or welded to the second plating 36 at a location substantially centered over the TCOS 30. In this and other embodiments, the first cavity and second cavity can be rectangular holes that are routed within the substrate 16. However, other geometries such as ovals and rounded rectangles are also usable as cavity shapes without deviating from the objectives of the present disclosure.

In at least some embodiments, the TCOS 30 is a direct bonded copper (DBC structure) having a ceramic substrate 38 with top-side copper 40 and bottom-side copper 42 as best seen in FIG. 4. The ceramic substrate 26 can be, but is not limited materials such as Alumina ($Al_2O_3$), aluminum nitride (AlN), and Beryllium oxide (BeO). Vias 44 provide electrical connections source and gate leads disposed on the top-side and bottom-side of the substrate 16.

Figure 5:
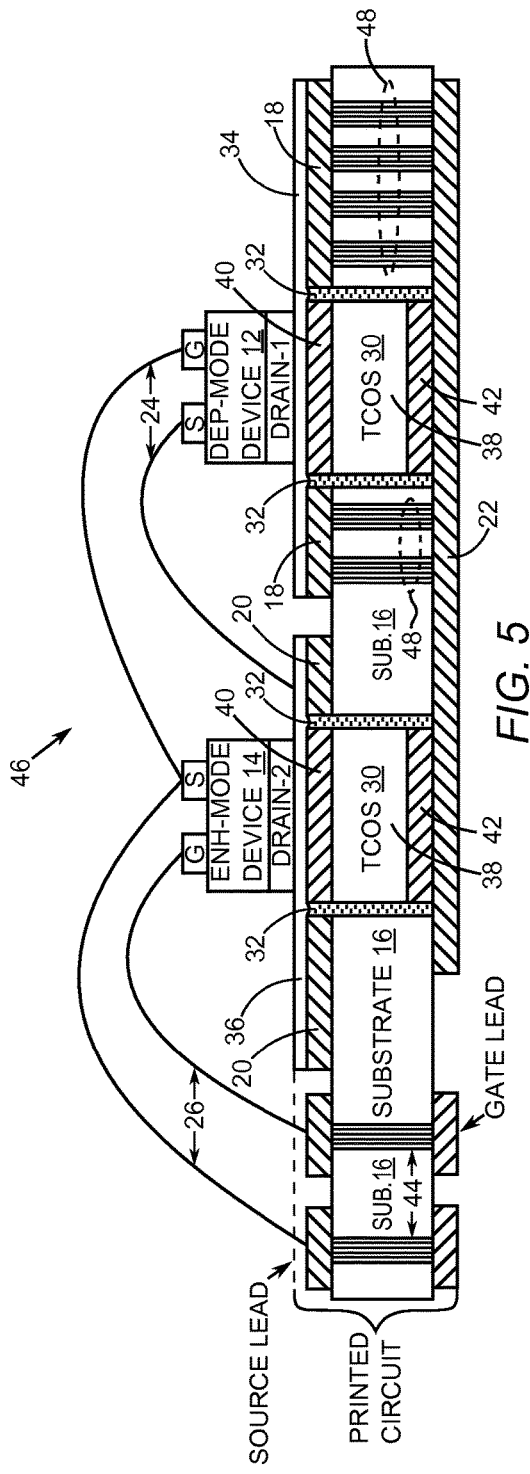
FIG. 5 is a cross-sectional view of another exemplary embodiment that uses direct bonded copper (DBC) slugs to transfer heat away from the depletion mode device and the enhancement mode device.

FIG. 5 is a cross-sectional view of an exemplary embodiment of another integrated power module 46 of the present disclosure that has improved electrical isolation and improved thermal conductivity. This exemplary embodiment replaces the TECS 28 of the integrated power module 10 with another TCOS 30. In this case, vias 48 provide electrical connections between the top d-drain pad 18 and the bottom d-drain pad 22.

Those skilled in the art will recognize improvements and modifications to the embodiments of the present disclosure. All such improvements and modifications are considered within the scope of the concepts disclosed herein and the claims that follow.

What is claimed is:

1. An integrated power module having a depletion mode device and an enhancement mode device that is configured to prevent an accidental on-state condition for the depletion mode device during a gate signal loss comprising:
    a substrate having a bottom drain pad for the depletion mode device disposed on the substrate and an enhancement mode device footprint-sized cavity that extends through the substrate to the bottom drain pad; and
    a thermally conductive and electrically insulating slug substantially fills the cavity.

2. The integrated power module of claim 1 wherein non-conductive epoxy fills gaps within the cavity between the thermally conductive and electrically insulating slug and the substrate.

3. The integrated power module of claim 1 further including a top drain pad for the enhancement mode device wherein the top drain pad is substantially centered over the cavity.

4. The integrated power module of claim 3 further including electrically conductive plating disposed over the top drain pad and the thermally conductive and electrically insulating slug.

5. The integrated power module of claim 1 wherein the substrate includes a depletion mode device footprint-sized cavity that extends through the substrate to the bottom drain pad.

6. The integrated power module of claim 5 further including a thermally conductive and electrically conductive slug that substantially fills the depletion mode device footprint-sized cavity.

7. The integrated power module of claim 6 wherein the thermally conductive and electrically conductive slug has a thermal conductivity of at least 150 Watts per meter Kelvin (W/mK).

8. The integrated power module of claim 7 wherein the thermally conductive and electrically conductive slug is made of copper.

9. The integrated power module of claim 6 wherein non-conductive epoxy fills gaps within the depletion mode device footprint-sized cavity between the thermally conductive and electrically conductive slug and the substrate.

10. The integrated power module of claim 9 further including a top drain pad for the depletion mode device wherein the top drain pad is substantially centered over the depletion mode device footprint-sized cavity.

11. The integrated power module of claim 5 further including a thermally conductive and electrically isolating slug that substantially fills the depletion mode device footprint-sized cavity.

12. The integrated power module of claim 11 wherein non-conductive epoxy fills gaps within the depletion mode device footprint-sized cavity between the thermally conductive and electrically isolating slug and the substrate.

13. The integrated power module of claim 12 further including a top drain pad to which a drain of the depletion mode device is electrically coupled.

14. The integrated power module of claim 13 further including electrically conductive vias between the top drain pad and the bottom drain pad.

15. The integrated power module of claim 14 further including electrically conductive plating that covers the top drain pad and the thermally conductive and electrically isolating slug and the substrate.

16. The integrated power module of claim 1 wherein the thermally conductive and electrically insulating slug is direct bonded copper (DBC) with a ceramic substrate.

17. The integrated power module of claim 16 wherein the ceramic substrate is made of alumina ($Al_2O_3$).

18. The integrated power module of claim 16 wherein the ceramic substrate is made of aluminum nitride (AlN).

19. The integrated power module of claim 16 wherein the ceramic substrate is made of beryllium oxide (BeO).

20. The integrated power module of claim 16 wherein the thermal conductivity of the DBC has a thermal conductivity of at least 150 Watts per meter Kelvin (W/m K).

\* \* \* \* \*